United States Patent
Paysan

[11] Patent Number: 6,125,381
[45] Date of Patent: Sep. 26, 2000

[54] RECURSIVELY PARTITIONED CARRY SELECT ADDER

[76] Inventor: Bernd Paysan, Stockmannstrasse 14, D-81477 Munich, Germany

[21] Appl. No.: 08/984,572

[22] Filed: Dec. 3, 1997

[30] Foreign Application Priority Data

Dec. 20, 1996 [DE] Germany .................. 196 53 565

[51] Int. Cl.⁷ ...................................................... G06F 7/50
[52] U.S. Cl. ........................................................... 708/714
[58] Field of Search ............................ 364/788; 708/714

[56] References Cited

U.S. PATENT DOCUMENTS

| | | | |
|---|---|---|---|
| 5,272,662 | 12/1993 | Scriber et al. ................ | 364/788 |
| 5,732,008 | 3/1998 | Abu-Khater ................ | 364/788 |
| 5,764,550 | 6/1998 | D'Souza ...................... | 364/788 |
| 5,852,568 | 12/1998 | Ranjan ......................... | 364/788 |

*Primary Examiner*—David H. Malzahn
*Attorney, Agent, or Firm*—Michael J. Striker

[57] ABSTRACT

A recursive divide and conquer strategy is applied to the structure of carry select adders. This adder is partitioned into two components, each computing the sums of their inputs with and without carry in, and each component is then recursively partitioned further. The two components are combined by selecting the appropriate part of the more significant sum using the carries of the less significant component.

3 Claims, 2 Drawing Sheets

RECURSIVELY PARTITIONED CARRY SELECT ADDER

BACKGROUND OF THE INVENTION

1. Field of the Invention

The present invention relates to adder circuits for modern central processing units (CPUS) of digital computers and, more particularly, to carry selected adders.

2. Prior Art

In principle, binary sums are computed by computing the sum of two input bits with equal significance and the corresponding carry in. The result is one bit of the sum of the same significance, and the carry out, which is carry in for the computation of the next more significant bit. Sequential propagation of carries (ripple carry adder) with state of the art adders is only appropriate for operands that are only a few bits wide.

State of the art addition in hardware uses a recursive divide and conquer strategy to speed up carry propagation. The most widely used fast binary adder algorithm is the carry-look-ahead adder. The basic principle is a divide and conquer strategy to handle carry propagation.

The operands are split into parts, e.g. lower significant and higher significant half. The 2n bit adder 10n correspondingly is divided into a more significant component 19n and a less significant component 18n as shown in FIG. 1a, which compute the sum of the more significant and less significant operand parts. This split is continued until the operands are one bit wide as shown in FIG. 1b. There a half adder performs the initial operation. A half adder adds two bits, producing one bit sum so and one bit carry co.

FIGS. 1a and 1b show the handling of the carry propagation: a carry is propagated through a basic element, if the half adder's sum is 1. A carry is propagated through a combination of two parts, if both parts propagate carry, thus cp for both elements is 1. The carry propagation thus is handled by an AND tree of AND gates 16n.

The real carry propagation is computed backward then. Each part outputs carry co, if both carry in ci and carry propagate cp is true, or the higher significant subpart outputs carry from OR gate 17n as seen in FIG. 1a. The so bits of the sum are computed with an exclusive or of the sum output, e.g. with XOR gate 12 from the sum output of the 1 bit adder 14 with the corresponding carry in, ci. The gate delay per subdivision (by two) thus is three elementary gates (two input AND/OR or NAND/NOR gates), which are often combined into one large gate. In FIGS. 1a and 1b the AND gate is indicated symbolically with &, the OR gate, with | and the XOR gate, with Λ.

Carry-look-ahead logic is further improved combining a higher number of parts (e.g. four instead of two) in one step and using larger gates (with more than two inputs) in turn. Carry select logic is used to speed up carry propagation, leading to a critical path of e.g. four large gates for a 64 bit adder.

Carry select adders compute both the sum with and without carry (thus a+b and a+b+1 for inputs a and b) for a number of subpartitions. Carry in of each subpartition is used to select the correct sum of the next subpartition (towards higher significance) using a n bit wide multiplexer. The subpartitions usually are computed using ripple carry addition. Carry propagation can be improved using carry look ahead logic.

SUMMARY OF THE INVENTION

Addition is one of the critical operations in modern CPUs. Adders are used e.g. for arithmetic logic units, for address computation, and for floating point. Both space and time consumption of adders therefore is critical and should be minimized. The purpose of this invention is therefore, to construct an adder which uses less transistors than other known adders with very short path delays, while being as fast or even faster.

This object is attained according to the invention by applying divide and conquer strategy to carry select adders. Thus an n bit adder is recursively partitioned into components, which each perform an addition using successively smaller adders structured by recursive partitioning in the same manner as the former larger adder. Each part or component according to the invention computes the sums $s_0$ and $s_1$ and carries $c_0$ and $c_1$ with and without carry in, thus $s_1 = s_0 + 1$.

BRIEF DESCRIPTION OF THE DRAWING

The objects, features and advantages of the invention will now be illustrated in more detail with the aid of the following description of the preferred embodiments, with reference to the accompanying figures in which.

DETAILED DESCRIPTION OF THE PREFERRED EMBODIMENT

Figure 2A:
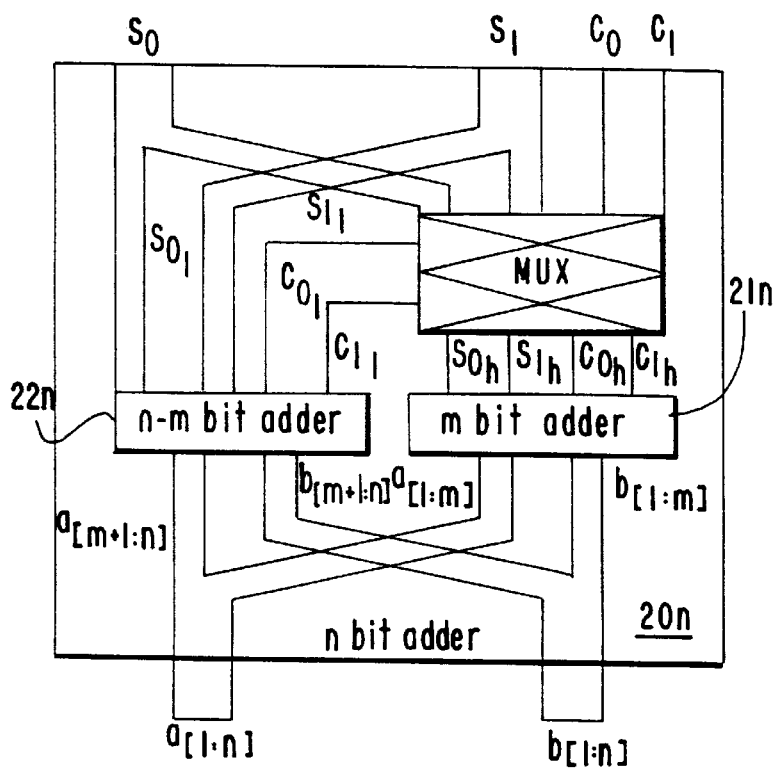
FIG. 2b is a block diagram of a 1 bit carry select adder component according to the invention.

The n bit adder 20n in FIG. 2a is partitioned in a known way into components 21n, 22n. The more significant component 21n is an m bit adder and the less significant component 22n is an n-m bit adder.

Each component according to the invention computes the sums $s_0$ and $s_1$ and carries $c_0$ and $c_1$ with and without carry in, thus $s_1 = s_0 + 1$. As FIG. 2a shows, two elements are combined using carry out of the two less significant sums $s_{0l}$ and $s_{1l}$, to select sum and carry from the higher significant sums $S_{0h}$ and $S_{1h}$. Then $s_{0l}$ and $S_{0h}$ are combined to the sum $s_0$ (without carry in), $s_{1l}$ and $s_{1h}$ are combined to the sum $s_1$ (with carry in).

Each n bit wide unit (adding n bit wide numbers to form two n+1 bit wide results, including carry) thus uses two m+1 bit wide 2:1 multiplexers mux, or one m+1 bit wide 2:2 multiplexer. If the bit width of the adder isn't $2^N$ with an integer N, it is best to use the next smaller number in the form $2^M$ with integer M as higher part width, to reduce the carry path length, and best to use this width as lower part to reduce the number of gates.

Figure 1A:
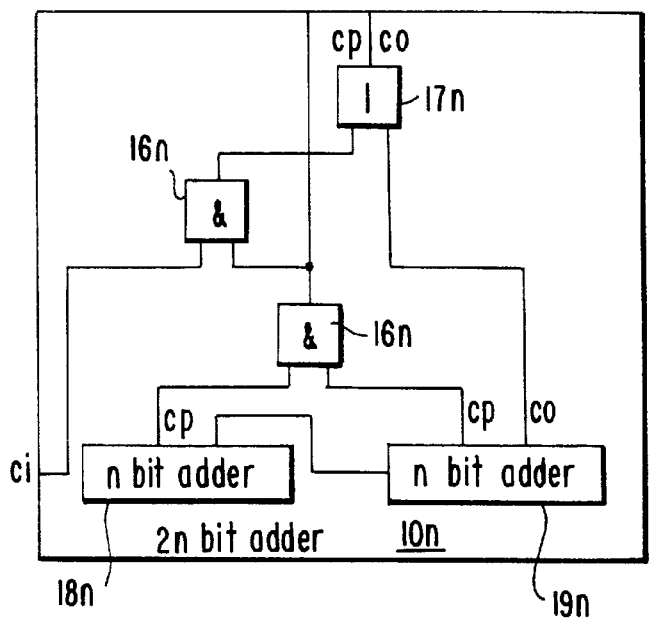
FIG. 1a is a block diagram of a prior art 2n bit adder.
Figure 1B:
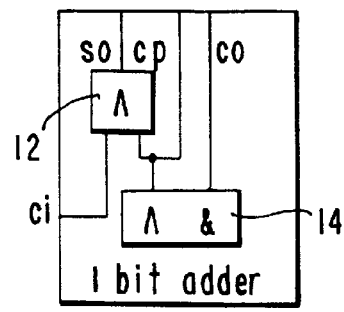
FIG. 1b is a block diagram of a prior art 1 bit part of the adder shown in FIG. 1a, FIG. 2a is a block diagram of a recursively partitioned n bit carry select adder according to the invention.
Figure 2B:
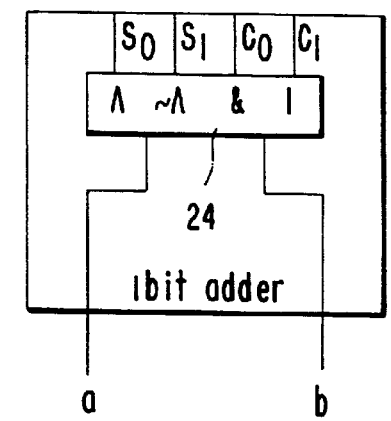

The initial one bit sum is computed, e.g. as shown in FIG. 2b in a 1 bit adder 24, using an XOR/AND gate for the sum $s_0$ and carry $c_0$ without carry in, and an XNOR/OR gate for the sum $s_1$ and carry $c_1$ with carry in. The XOR/AND gate and the XNOR/OR gate are indicated, as mentioned in connection with FIGS. 1a and 1b, symbolically with Λ/ & and ~Λ/| respectively.

Figure 3:
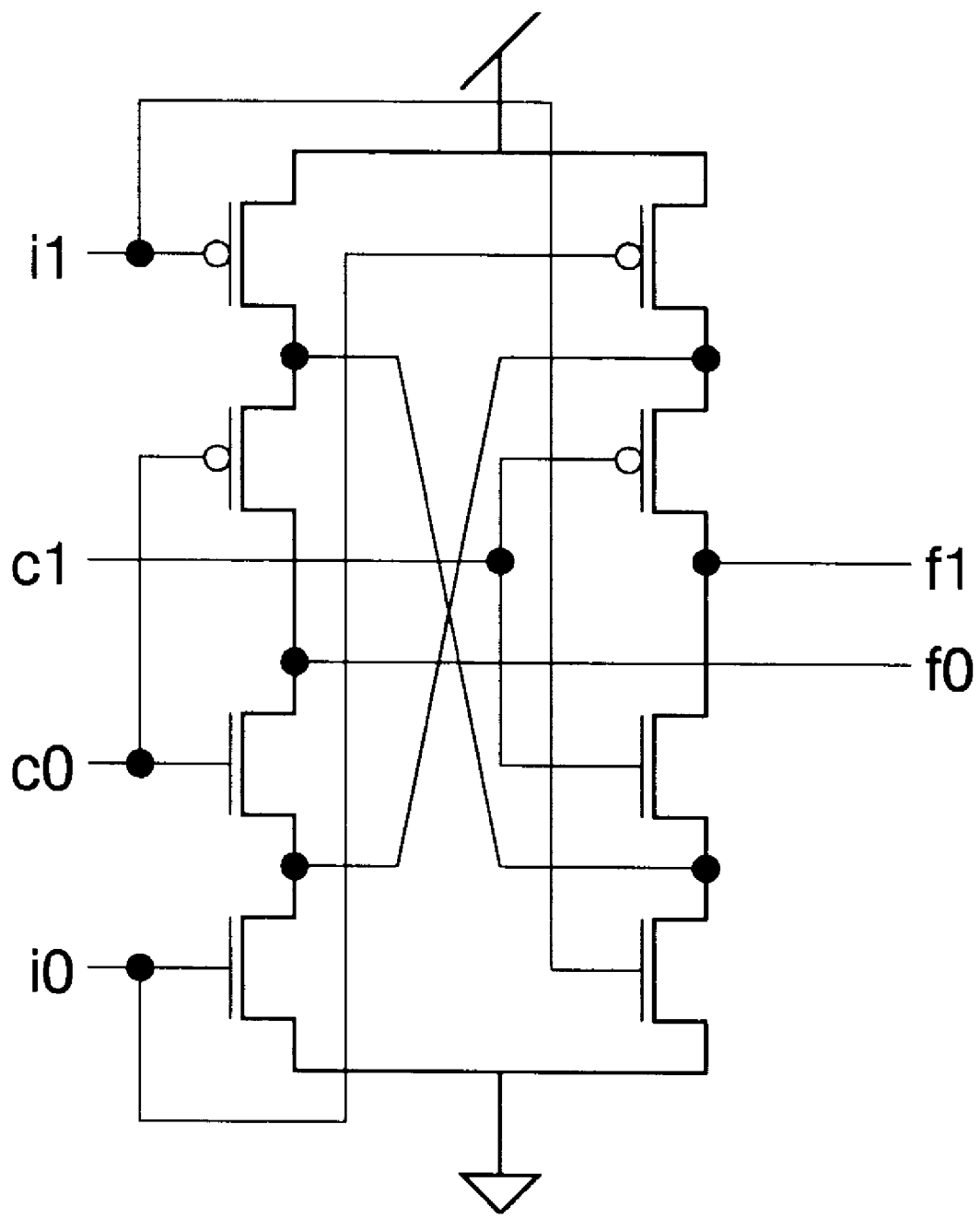
FIG. 3 is a diagram showing the transistor logic of a one-bit 2:2 multiplexer in CMOS technology.

Essential parts for this adder are multiplexers mux. Especially each component uses two 2:1 multiplexers with the same inputs. Therefore it is advantageous to combine both multiplexers into one 2:2-multiplexer. This is solved advantageous using the inverting one-bit 2:2-multiplexer, shown in FIG. 3. This gate computes $$f_0 = \overline{c_0} * i_0 \; O \; \overline{c_0} * i_1$$

$$f_1 = \overline{c_1} * i_0 \; O \; \overline{c_1} * i_1$$

with approximately the same speed as a two input NAND gate with two inputs, where $c_0$ and $c_1$ are the control signals, $i_0$ and $i_1$ are the input signals, and $f_0$ and $f_1$, are output signals. n one bit multiplexers are combined in a known way to form an n bit wide multiplexer.

Since each bit of the sum has an individual number of multiplexers to pass through (at most $\log_2 n$), one additional inversion has to be applied to those passing through the multiplexer gates with an odd number of total inversions. This is best done in the initial step by exchanging the XOR with the XNOR gate. Inversion of carry only changes routing, thus $i_0$ and $i_1$ lines must be swapped if the selection uses an inverted carry as input.

With increasing computation, carry out must drive larger multiplexers, thus more gates. This can be reduced by either duplicating the gate which computes the carry (one gate for selecting the next carry, one for selecting the sum bits), or by using additional buffers or inverters to drive the selection of sum bits, thus each carry out needs to drive only one one-bit multiplexer and one or few buffers/inverters.

The advantage of this invention can be estimated as follows:

The number of 2:2 multiplexer for sum selection in a 64 bit adder without carry in is 192, the number of multiplexers for carry selection is at least 63. The number of transistors for the multiplexer network therefore is thus at least 2040, not including additional buffers or inverters. The critical path includes one very fast XOR gate and six very fast multiplexer gates. The XOR and XNOR-gates can be modeled using two inverters (two transistors each) and one 2:2-multiplexer, selecting between input a and input $\overline{a}$ using b and $\overline{b}$ as control signals.

Using commercial NAND/NOR gates for the initial carry computation (4 transistors per gate) a transistor count of at least 3320 transistors for a 64 bit adder without carry in, and of at least 3832 transistors for a 64 bit adder with carry in (using commercial 8 transistor inverting multiplexers) results.

To concentrate drive strength of the multiplexer on the critical path (the selection of carries), thus only two gates (either two multiplexer, or one multiplexer and one inverter/buffer), at least 31 inverters or buffers (62 transistors) are needed. The setup time of the sum selecting multiplexers doesn't add much delay, since the initial XOR gates have a longer delay than the carry creating NAND/NOR gates, and the setup delay doesn't sum up.

I claim:

1. A recursively partitioned carry select adder, said carry select adder comprising means for computing an n bit sum and carry ($s_0$, $c_0$) of two n bit numbers (a,b) without carry in and another n bit sum and carry ($s_1$, $c_1$) of said two n bit numbers with carry in, wherein n is an integer greater than 1 and said means for computing comprises an m bit wide recursively partitioned carry select adding device comprising means for computing an m bit sum and carry ($S_{0h}$, $C_{0h}$) of an m bit more significant part of said two n bit numbers (a,b) without carry in and another m bit sum and carry ($S_{1h}$, $c_{1h}$) of said m bit more significant part of said two n bit numbers with carry in, said m being less than n;

an n-m bit wide recursively partitioned carry select adding device comprising means for computing an n-m bit sum and carry ($s_{0l}$, $c_{0l}$) of an n-m bit less significant part of said two n bit numbers (a,b) without carry in and another n-m bit sum and carry ($s_{1l}$, $c_{1l}$) of said n-m bit less significant part of said two n bit numbers with carry in;

and two m+1 bit wide 2:1 multiplexers or one m+1 bit wide 2:2 multiplexer, wherein said 2:1 multiplexers or said 2:2 multiplexer comprise means for selecting between the sums ($S_{0h}$, $S_{1h}$) and the carries ($c_{0h}$, $C_{1h}$) of said m bit more significant part according to said carries ($c_{0l}$, $c_{1l}$) of said less significant part; and a plurality of XNOR gates and XOR gates for computing 1 bit sums of respective corresponding bits of said two n bit numbers (a,b) with and without carry in, and either a plurality of AND gates and OR gates for computing the carries with and without carry in or a plurality of NAND and NOR gates for computing inverted carries with and without carry in.

2. The recursively partitioned carry select adder as defined in claim 1, wherein said m is a largest integer power of 2 less than said n, whereby a propagation time for said carries is reduced.

3. The recursively partitioned carry select adder as defined in claim 1 or 2, wherein said 2:1 multiplexers or said 2:2 multiplexer are or is inverting and said 1 bit sums are inverted by exchanging said XOR and XNOR gates, whereby a result of the inverting is normalized as if said 2:1 multiplexers or said 2:2 multiplexer were not inverting and wherein said m bit wide recursively partitioned carry select adding device outputs a one's complement.

\* \* \* \* \*